(12) United States Patent
Raravikar et al.

(10) Patent No.: US 9,028,142 B2
(45) Date of Patent: May 12, 2015

(54) INTEGRATED MICROELECTRONIC PACKAGE TEMPERATURE SENSOR

(75) Inventors: Nachiket R. Raravikar, Chandler, AZ (US); Neha Patel, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 43 days.

(21) Appl. No.: 13/447,469

(22) Filed: Apr. 16, 2012

(65) Prior Publication Data

US 2012/0199830 A1 Aug. 9, 2012

Related U.S. Application Data

(63) Continuation of application No. 11/477,267, filed on Jun. 29, 2006, now abandoned.

(51) Int. Cl.
*G01K 7/00* (2006.01)
*G01K 7/16* (2006.01)
*B82Y 15/00* (2011.01)

(52) U.S. Cl.
CPC . *G01K 7/16* (2013.01); *B82Y 15/00* (2013.01); *G01K 2211/00* (2013.01); *Y10S 977/955* (2013.01)

(58) Field of Classification Search
USPC ............ 374/183, 141, 112, 166; 977/955
See application file for complete search history.

(56) References Cited

U.S. PATENT DOCUMENTS

| | | | |
|---|---|---|---|
| 6,778,316 B2 * | 8/2004 | Halas et al. | 359/296 |
| 6,855,603 B2 * | 2/2005 | Choi et al. | 438/268 |
| 6,919,730 B2 * | 7/2005 | Cole et al. | 324/715 |
| 7,011,737 B2 * | 3/2006 | Varghese et al. | 205/189 |
| 7,118,941 B2 | 10/2006 | Zhang et al. | |
| 7,194,912 B2 * | 3/2007 | Jordan et al. | 73/774 |
| 7,247,877 B2 | 7/2007 | Hakey | |
| 2004/0188780 A1 * | 9/2004 | Kurtz | 257/414 |
| 2004/0238907 A1 * | 12/2004 | Pinkerton et al. | 257/419 |
| 2004/0266065 A1 * | 12/2004 | Zhang et al. | 438/122 |
| 2005/0036905 A1 * | 2/2005 | Gokturk | 422/55 |
| 2005/0249262 A1 * | 11/2005 | Bando et al. | 374/202 |
| 2006/0038167 A1 * | 2/2006 | Hakey et al. | 257/24 |
| 2006/0118720 A1 * | 6/2006 | Roman et al. | 250/332 |
| 2007/0034975 A1 * | 2/2007 | Kurtz | 257/415 |

(Continued)

FOREIGN PATENT DOCUMENTS

TW I256660 6/2006
TW I256877 6/2006

OTHER PUBLICATIONS

Chinese Patent Office, Chinese Second Office Action (w/English translation) issued in corresponding CN Application No. 200710129019.6, 15 pages, Nov. 23, 2011.

(Continued)

*Primary Examiner* — Mirellys Jagan
(74) *Attorney, Agent, or Firm* — Trop, Pruner & Hu, P.C.

(57) ABSTRACT

Temperatures in microelectronic integrated circuit packages and components may be measured in situ using carbon nanotube networks. An array of carbon nanotubes strung between upstanding structures may be used to measure local temperature. Because of the carbon nanotubes, a highly accurate temperature measurement may be achieved. In some cases, the carbon nanotubes and the upstanding structures may be secured to a substrate that is subsequently attached to a microelectronic package.

10 Claims, 5 Drawing Sheets

(56) References Cited

U.S. PATENT DOCUMENTS

| | | | |
|---|---|---|---|
| 2007/0045756 A1* | 3/2007 | Chang et al. | 257/414 |
| 2007/0114573 A1* | 5/2007 | Han et al. | 257/226 |
| 2007/0116628 A1* | 5/2007 | Shew et al. | 423/447.2 |
| 2007/0117213 A1* | 5/2007 | Cole et al. | 436/146 |
| 2007/0134599 A1* | 6/2007 | Raravikar et al. | 430/325 |
| 2007/0134866 A1* | 6/2007 | Huang et al. | 438/199 |
| 2007/0228361 A1* | 10/2007 | Raravikar et al. | 257/40 |
| 2008/0159960 A1* | 7/2008 | Klingeler et al. | 424/9.32 |
| 2009/0165533 A1* | 7/2009 | Han et al. | 73/31.06 |
| 2010/0136341 A1* | 6/2010 | Kirkor et al. | 428/408 |
| 2010/0308848 A1* | 12/2010 | Kaul | 324/693 |
| 2011/0051775 A1* | 3/2011 | Ivanov et al. | 374/143 |
| 2011/0210415 A1* | 9/2011 | Altavilla et al. | 257/467 |
| 2012/0037306 A1* | 2/2012 | Dai et al. | 156/249 |
| 2012/0125771 A1* | 5/2012 | Salzer et al. | 204/412 |
| 2012/0258275 A1* | 10/2012 | Maeno | 428/95 |
| 2013/0195140 A1* | 8/2013 | Scardaci et al. | 374/163 |

OTHER PUBLICATIONS

Taiwan Patent Office, Taiwan Office Action and Search Report (w/English translation) issued in corresponding TW Application No. 096123330, 13 pages, dated Mar. 12, 2011.

Anyuan, C. et al.: "Assembly of mm-scale macrobridges with carbon nanotube bundles", Applied Physics Letters, vol. 83, No. 2, 3 pages, Jul. 14, 2003.

Dorozhkin, P. et al.: "A Liquid Ga-Filled Carbon Nanotube: A Miniaturized Temperature Sensor and Electrical Switch", Small 2005, No. 11, pp. 1088-1093.

Jung, Y.J. et al.: "High-Density, Large Area, Single-Walled Carbon Nanotube Networks on Nanoscale-Patterned Substrates", J. Phys. Chem., B 2003, vol. 107, No. 28, pp. 6859-6864.

Li, Z. et al.: "Carbon Nanotube Film Sensors", Adv. Materials, Apr. 5, 2004, vol. 16, No. 7, 4 pgs., http://www.advmat.de.

* cited by examiner

INTEGRATED MICROELECTRONIC PACKAGE TEMPERATURE SENSOR

CROSS-REFERENCE TO RELATED APPLICATIONS

This application is a continuation of U.S. patent application Ser. No. 11/477,267, filed on Jun. 29, 2006 now abandoned.

BACKGROUND

This relates generally to measuring temperature in connection with microelectronic packages and components.

The effects of temperature on microelectronic packages and components may be various. Many packaging processes involve the application of elevated temperatures. These elevated temperatures may adversely affect components, including the integrated circuit chip within the package. In addition, the packages may be exposed to various other temperature effects which may have an impact on the packaged components. Also, the integrated circuits themselves can be exposed to various temperature conditions.

It is known how to integrate integrated circuit temperature sensors within an overall integrated circuit. Temperature readings can be obtained from serpentine, integrated temperature sensors. However, the accuracy of these measurements may, in some cases, be limited. Moreover, the temperature sensors may take up a relatively significant percentage of the overall available integrated circuit space. Also, in some cases, the places at which such temperature sensors can be formed are limited. Namely, there are generally limited to areas of sufficient size that can receive such an integrated element.

DETAILED DESCRIPTION

Figure 1:
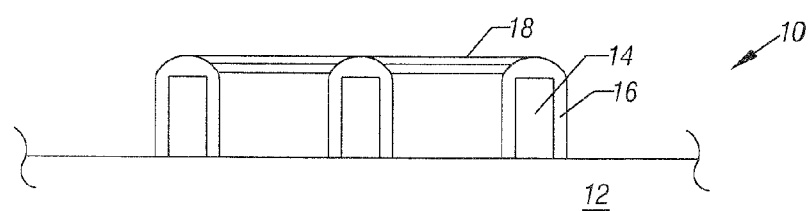
FIG. 1 is a greatly enlarged, partial, cross-sectional view of one embodiment of the present invention.

Referring to FIG. 1, in accordance with some embodiments of the present invention, a temperature sensor 10 may be formed on an integrated circuit substrate 12. A plurality of metallic structures 16 may be formed which extend upwardly from the substrate 12. The structures 16 may be made of a material suitable for the growth of bridge-like carbon nanotubes 18. Those carbon nanotubes 18 may act as temperature sensors. Namely, the conductivity of those nanotubes is a function of temperature. By measuring the conductivity of the nanotubes, by passing current through them, one can determine the local temperature.

In some embodiments of the present invention, a large number of upstanding structures 16 may be formed. They may be formed in regular arrays, in some embodiments, using well known techniques. The arrays may be composed of an inner pillar 14 which may be a non-metallic material and a metallic coating that forms the upstanding structure 16.

Carbon nanotubes 18 may bridge between adjacent structures 16. Thus, a plurality of carbon nanotubes 18 may be randomly arranged in a generally horizontal configuration transverse to the upstanding structures 16.

In some embodiments of the present invention, the structures 16 may be formed directly on the substrate 12. The structures 16 may include the pillars 14, in one embodiment of the present invention, covered by a metal catalyst to form the metallic structure 16. Suitable metal catalysts include iron, cobalt, and nickel. As an example, the structure 16 may be of a height of about a micron.

The structures may be formed, for example, by glancing angled deposition methods. By controlling the substrate 12 rotational motion, including both its angle and velocity, the structure 16 height can be controlled. Although different metal catalysts may be utilized to form the structures 16, nickel may be preferred because it may offer lower contact resistance with the nanotubes 18 to be formed subsequently.

Figure 2:
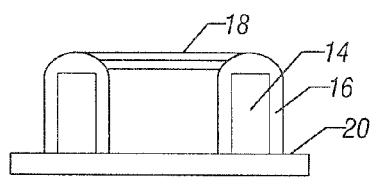
FIG. 2 is a greatly enlarged, cross-sectional view of the embodiment shown in FIG. 1 after further processing.

In some embodiments of the present invention, some number of the upstanding structures 16 on the substrate 12 may be used to make a separable unit 20, shown in FIG. 2. The separable unit 20 may be formed of a portion of the substrate 12 whose thickness has been reduced so that the substrate thickness does not adversely affect the temperature measurements. Thus, the substrate 12 may be reduced in size and thickness to form the unit 20 with some lesser number of upstanding structures 16 formed thereon.

The carbon nanotubes 18, shown in FIG. 1, may be grown so as to bridge between structures 16. This is particularly useful when large arrays of structures 16 are provided in regular rows and columns. In one embodiment, gas phase chemical vapor deposition may be used to grow the carbon nanotubes. In one embodiment of the present invention, methane may be used as a source for carbon for the growth of carbon nanotubes. As a result, nanotubes may extend from one upstanding structure to another. Argon gas may be supplied during the deposition of the carbon nanotubes to reduce oxidation. A pressure of about 500 Torr and a furnace temperature in a range including, but not limited to, 800 to 950 degrees Celsius in the methane environment may be utilized in one embodiment.

Advantageously, adjacent structures 16 are spaced reasonably proximately so that the carbon nanotubes (FIG. 3) of a given length may span across them.

The structures 16 may be formed, in one embodiment, by depositing a catalyst over the pillar 14, preformed on the substrate 12. For example, the pillars 14 may be silicon or silicon dioxide pillars. The pillars may be formed, for example, by growing or depositing the pillar material, masking, and etching to form the pillars in the desired arrangement. In some embodiments, at least two of the pillars may be aligned with a crystallographic plane of the substrate 12 in an embodiment where the substrate is a crystalline semiconductor.

During catalyst film deposition, the substrate 12 may be tilted twice about +/−45 degrees to spread the catalyst over the pillars 14 to form the structures 16. The carbon nanotubes 18 later form on the tops and sidewalls of the pillars 14 where the catalyst is present. The catalyst may not completely cover the pillars in some cases.

In some embodiments, an array of pillars (not shown) may be grown, but only some of the pillars may be activated with the catalyst. For example, only two pillars may be activated with catalyst so carbon nanotubes bridge only the two catalyst activated pillars. The selective activation may be accomplished using masks or selective catalyst deposition. While cylindrically shaped structures 16 are depicted, other shapes may also be used.

Generally, the nanotubes 18 grow generally or roughly horizontally from the top to the bottom along the structures 16. The nanotubes span like bridges over the substrate 12.

In some embodiments, the substrate 12 (FIG. 1) may subsequently be thinned down to form the unit 20 (FIG. 2) so that its own thickness does not contribute to changes in the temperature of the die whose temperature is being measured. A thinned down unit 20 may then be glued onto any polymeric or ceramic surface.

Figure 3:
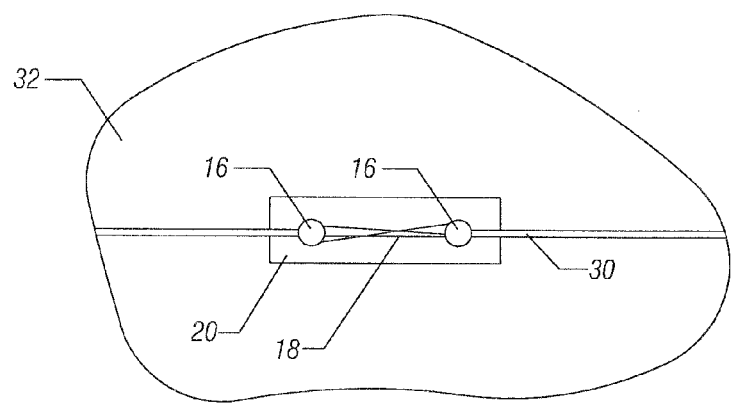
FIG. 3 is a top plan view of the embodiment of FIG. 2 in position on an integrated circuit or other microelectronic package component.

Referring to FIG. 3, the nanotubes 18 may then be electrically coupled to an external temperature sensor (not shown) using metal lines 30. Particularly, the unit 20 may be adhesively secured to a structure 32 whose temperature is to be measured. Then, metal lines 30 may be deposited or otherwise formed to the structures 16. The metal lines 30 may then connect each side of the array of carbon nanotubes 18 to a suitable pad (not shown) to which a temperature sensing circuit may be attached. The metal lines 30 and the pads may be printed using conventional processes such as screen printing or plating.

In other embodiments, the nanotubes may be prepared on a substrate using a tall pillar pattern such as one which uses staples secured to a substrate. By "tall," it is intended to refer to structures 16 having a height on the order of (but not limited to) 0.7 centimeters. Subsequently, the nanotubes are grown and metallizations are completed. Other structures 16 may be also be utilized to grow bridge-like carbon nanotubes, including telephone pole and soccer goal oriented office staples. Literally, upstanding office staples may be utilized by securing them to silicon wafers using an appropriate adhesive such as carbon tape. The staples may have their points upstanding ("telephone poles") or inverted ("soccer goal") and extending into the substrate.

Then, carbon nanotubes may be grown using chemical vapor deposition in a furnace at 1373 degrees Kelvin under about 100 m Torr vacuum. To 0.02 g/ml solution of ferrocene and 10 ml of hexane, two volume percent thiophene is added. The hexane may act as a source of carbon and the ferrocene acts as a catalyst for gas diffusion formation of carbon nanotubes. The solution may be heated to 150° C. and then introduced into a horizontal quartz tube furnace at an average rate of 0.1 mls. per minute for ten minutes. Other process parameters may also be used.

Thiophene is known to promote the formation of single walled carbon nanotubes in a hydrogen gas atmosphere, whereas multi-walled carbon nanotubes are found to grow predominantly in the absence of a hydrogen gas atmosphere. Single walled carbon nanotubes or multi-walled carbon nanotubes can be used by controlling the nanotubes growth conditions by controlling the hydrogen gas concentration in the furnace (no hydrogen gas atmosphere giving multi-walled carbon nanotubes, whereas hydrogen gas atmosphere may promote the single walled carbon nanotube growth).

Although the recipe and numbers recited above are recommended to grow carbon nanotubes, the growth conditions are not limited to this recipe or these numbers, but, rather, is inclusive of them. In some temperature sensing applications, multi-walled carbon nanotubes may be advantageous.

Figure 4:
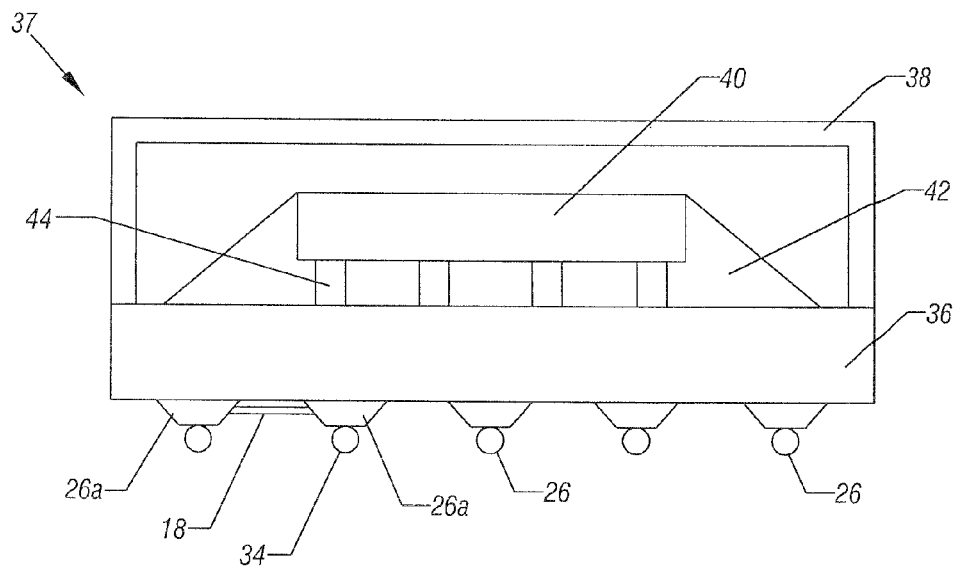
FIG. 4 is an enlarged, cross-sectional view of a package in accordance with one embodiment of the present invention.

Referring to FIG. 4, in accordance with one embodiment of the present invention, temperatures associated with surface mount techniques may be measured by growing carbon nanotubes across second level interconnects, such as solder ball or surface mount pads 26a. The pads 26a may mount solder balls 34. The solder balls 34 may couple the package 37 to an external printed circuit board (not shown) such as a motherboard.

The carbon nanotubes 18 may be grown so as to span between sufficiently adjacent pads 26a. In some cases, only some of the pads 26a may be used for the temperature measurement and other pads may have no such function, but, instead, function conventionally as second level interconnects. In some cases, the pads 26a may be otherwise electrically non-functional and may only be used for temperature measurement purposes.

The pads 26a may be formed on a suitable substrate 36, over which is mounted the integrated circuit die 40. A housing 38 may cover the die 40 and be secured to the substrate 36. First level interconnects 44 may be positioned between the die 40 and the substrate 36.

Figure 5:
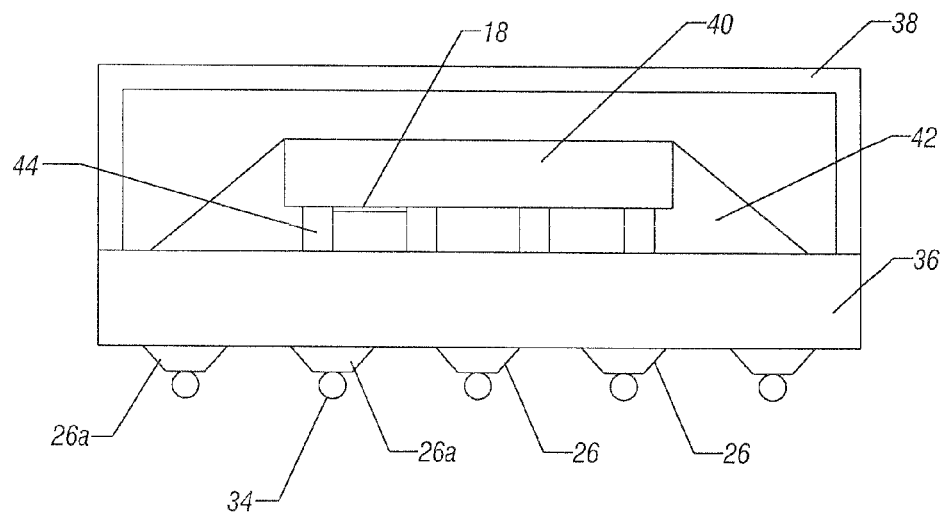
FIG. 5 is an enlarged, cross-sectional view of a package in accordance with another embodiment of the present invention.

Referring to FIG. 5, basically the same package is shown. However, in this case, the carbon nanotubes 18 are grown between first level interconnects 44, instead of between second level interconnects, as depicted in FIG. 4. In this way, carbon nanotubes 18 can be selectively grown between appropriately spaced elements to make temperature measurements for first and/or second level interconnects.

In some cases, the length of the carbon nanotubes may be different for different applications in order to span the necessary space. For example, in some cases, it may be desirable to have carbon nanotubes on the order of 1 micron to span between metal lines on a die, 10 to 50 microns to span between adjacent surface mount pads, and all the way up to 1 millimeter for adjacent solder bumps.

Generally, different techniques may be utilized to form the carbon nanotubes in different applications. In one embodiment, some interconnects, such as the solder ball pads 26, may be masked and other interconnects, such as the solder balls 26a, may not be masked so that the carbon nanotubes form only between the exposed pads 26a. As another example, a unit 20 may be laminated into position between adjacent pads 26a to achieve a comparable effect. As still another possibility, nanotubes in a solvent solution may be dispensed as a liquid at selected locations at room temperature and allowed to dry. As still another option, electrodeposition may be utilized.

For the first level interconnects, it may be desirable to use the electrodeposition or liquid deposition techniques to avoid exposing the substrate or die 40 to excessive temperatures that may be required in some carbon nanotube fabrication processes.

In some embodiments, it may be desirable for the first level interconnects, from the silicon to the substrate, to connect to second level interconnects that are actually active (non-temperature sensing) interconnects, even though the first level interconnects with the carbon nanotubes between them may be electrically non-functional for their normal interconnect (non-temperature sensing) purposes. Thus, the first level interconnects with the carbon nanotubes connected to them may be only functional for sensing temperature, but may be connected to second level interconnects that are effective, but are effective really only to convey the signals to and from the carbon nanotubes of the first level interconnects. Similarly, the second level interconnects with carbon nanotubes may be functional only for purposes of providing signals to and from the carbon nanotubes for purposes of making temperature measurements and perform no other interconnection function, in some embodiments.

In some embodiments, the nanotubes may be highly accurate temperature indicators. Because they have anisotropic characteristics in the length dimension and have very small dimensions transversely to length dimensions, high temperature resolutions may be obtained with carbon nanotubes. Carbon nanotubes may tend to be atomically relatively perfect and chemically stable and, therefore, may be more reliable as sensors than metallic structures of similar dimensions. In addition, temperatures in hard to reach locations may be measured in some cases.

Figure 6:
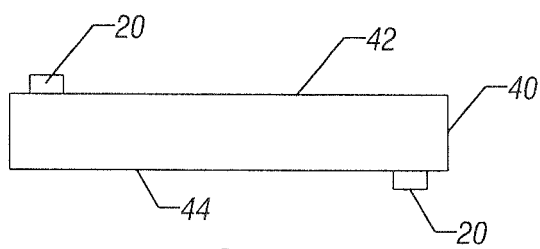
FIG. 6 is an enlarged, cross-sectional view of an integrated circuit in accordance with one embodiment of the present invention.

Referring to FIG. 6, the units 20 may be secured to opposite sides of an integrated circuit die 40 in another embodiment. In one embodiment, a unit 20 may be secured to the front side 42 of the die 40 and, in another embodiment, a unit 20 may be secured to the back side 44 of the die 40, as shown. In some cases, temperature sensing units 20 may be provided on both die sides, together with suitable metallizations to an external temperature sensor. The suitable metallizations may be provided to a current source which provides current to the carbon nanotubes in the units 20 and measures the resulting current therefrom to determine temperature in accordance with known principles.

Figure 7:
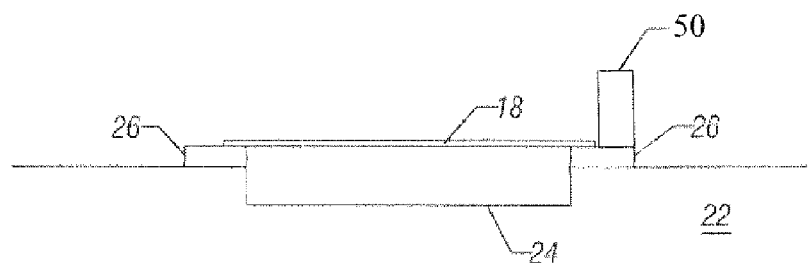
FIG. 7 is an enlarged, cross-sectional view of still another embodiment of the present invention using two spaced metallic lines.

Referring to FIG. 7, in accordance with another embodiment of the present invention, spaced metal lines 26 may be bridged by carbon nanotubes 18. The carbon nanotubes 18 may span an intermediate underlying trench 24 and a substrate 22. The metal lines 26 may be dummy metal lines for temperature purposes only or, in some cases, could be actual metal lines. Where the lines 26 are actual metal lines, these metal lines may be subsequently used for carrying signals, for example, by first destroying the carbon nanotubes 18 after having used them, if desired, for temperature measurements. Alternatively, the lines 26 may couple to a temperature sensor 50 that uses the varying resistance of the nanotubes to develop a temperature indication.

Figure 8:
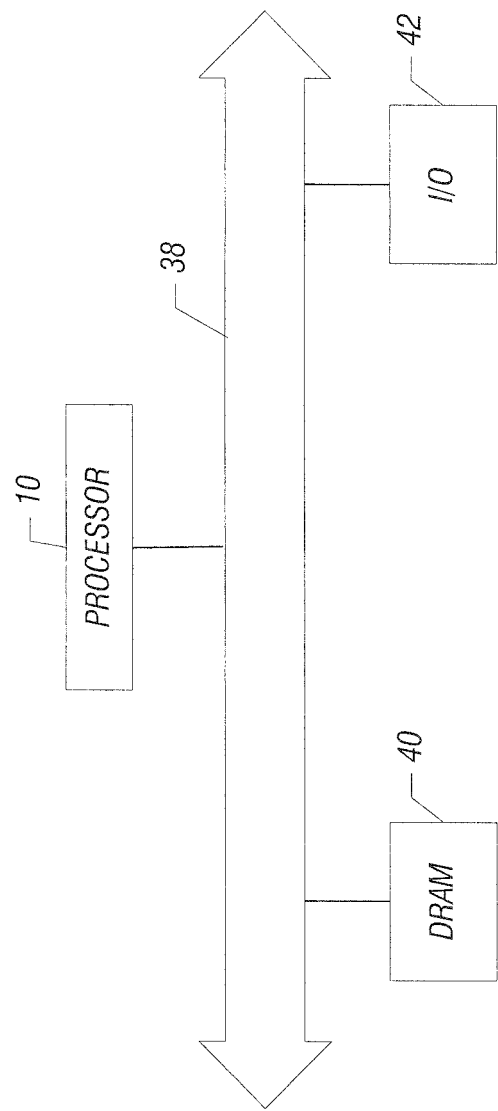
FIG. 8 is a system depiction in accordance with one embodiment of the present invention.

Finally, referring to FIG. 8, in accordance with some embodiments of the present invention, the integrated circuits or packaged devices with the integrated temperature sensors may be incorporated into a system including a processor 10. The processor 10 may be coupled by a bus 38 to a dynamic random access memory 40 and an input/output device 42. While a simple architecture is shown, many other embodiments may be possible.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A microelectronic component comprising:
   an integrated circuit substrate;
   a microelectronic element on said substrate;
   a pair of carbon nanotubes supported on said element; and
   a temperature sensor on said substrate, said substrate electrically coupled to said nanotubes, said sensor to use varying resistance of said nanotubes to develop a temperature indication.

2. The component of claim 1 wherein said component is a first level interconnect.

3. The component of claim 1 wherein said component is a second level interconnect.

4. The component of claim 1 wherein said component is part of an integrated circuit package.

5. The component of claim 1 wherein said component is a first level interconnect and is coupled to a second level interconnect.

6. The component of claim 1 wherein said carbon nanotubes extend between a pair of metallic structures.

7. The component of claim 1 wherein said component is an integrated circuit die.

8. The component of claim 7 including carbon nanotubes on opposite sides of said die.

9. The component of claim 1 wherein said carbon nanotubes are mounted on a substrate secured to said component.

10. The component of claim 9 wherein said carbon nanotubes are glued to said component.

* * * * *